United States Patent
Wong et al.

(10) Patent No.: US 7,259,401 B2
(45) Date of Patent: Aug. 21, 2007

(54) REFLECTION-TYPE OPTOELECTRONIC SEMICONDUCTOR DEVICE

(75) Inventors: Daw-Heng Wong, Chungho (TW); Hung-Yuan Su, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 129 days.

(21) Appl. No.: 10/923,025

(22) Filed: Aug. 23, 2004

(65) Prior Publication Data

US 2006/0038197 A1    Feb. 23, 2006

(51) Int. Cl.
*H01L 29/22*     (2006.01)
*H01L 29/24*     (2006.01)
(52) U.S. Cl. .......................... 257/98; 257/99; 257/100
(58) Field of Classification Search ................. 257/81, 257/98–100
See application file for complete search history.

(56) References Cited

U.S. PATENT DOCUMENTS 5,998,925 A     12/1999  Shimizu et al.
2002/0024808 A1*  2/2002  Suehiro et al. ............. 362/245

* cited by examiner

*Primary Examiner*—Hung Vu
(74) *Attorney, Agent, or Firm*—Birch, Stewart, Kolasch & Birch; LLP

(57) ABSTRACT

A reflection-type optoelectronic semiconductor device has an LED chip disposed on a first conducting wire portion, a second conducting wire portion connected to the LED chip via a connection wire, a packaging body for sealing the LED chip and part of the first conducting wire portion and the second conducting wire portion, a reflecting face disposed in an opposite direction of a light emission face of the LED chip and surrounding the packaging body, and an optical spectrum conversion layer coated onto the packaging body. A primary light emitted by the LED chip is reflected to the optical spectrum conversion layer by the reflecting face to undergo light excitation for producing a secondary light. The primary light and the secondary light are combined to generate a mixed light. A lens can be placed in the travel direction of the mixed light to change the distribution of the mixed light.

16 Claims, 5 Drawing Sheets

REFLECTION-TYPE OPTOELECTRONIC SEMICONDUCTOR DEVICE

BACKGROUND OF THE INVENTION

1. Field of the Invention

The present invention relates to a reflection-type optoelectronic semiconductor device and, more particularly, to a reflection-type optoelectronic semiconductor device combining a reflecting face and an optical spectrum conversion layer.

2. Description of Related Art

Light emitting diodes (LED) can be divided into two types according to different structures: lens-type and reflection-type. In a lens-type LED, light from the LED chip is emitted from the light emission face. Contrarily, in a reflection-type LED, light from the LED chip is reflected by a concave reflecting face and then emitted.

Because light from a reflection-type LED is reflected by a concave reflecting face and then emitted from a light emission face, the light of the LED chip can be effectively emitted to the front. A reflection-type LED thus has a higher external emission efficiency than a lens-type LED.

From 1968, when the earliest LED was proposed, LEDs of many colors have been continually developed. After Nichia Corporation in Japan successfully developed a higher-efficiency blue LED in 1993, full-color LED products could then be realized. After blue LEDs were developed, white LEDs became the target pursued by the industry.

Today, the most mature commercial products are inorganic white LEDs developed by the Nichia Corporation (in the disclosure of U.S. Pat. No. 5,998,925 announced in Dec. 7, 1999 and in the disclosure of R.O.C. Pat. No. TW383508 announced in Mar. 1, 2000). FIG. 1 shows the structure of a lens-type inorganic white LED. The periphery of a blue LED chip 40 is filled with yellow light fluorescent powder 50. Light emitted by the blue LED chip 40 is used to excite the yellow light fluorescent powder 50 for producing a yellow light. At the same time, a blue light is also emitted. This blue light matched with the yellow light will form a blue-yellow mixed white light, which is finally scattered outwards by a lens.

In the lens-type inorganic white LED, however, after the light from the blue LED chip 40 is emitted, its optical path can't be effectively controlled. Therefore, the light may directly excite the yellow light fluorescent powder 50 or may be directly scattered outside so that mixing of the blue light and the yellow light can't be effectively accomplished, hence lowering the light emission efficiency.

SUMMARY OF THE INVENTION

Accordingly, the present invention proposes a reflection-type optoelectronic semiconductor device, which makes use of a reflecting face of a parabolic surface or an elliptic surface to reflect light emitted by an LED chip. The reflected light can thus be effectively directed to an optical spectrum conversion layer to undergo light excitation for producing a fluorescent light more efficiently.

According to an embodiment of the present invention, in a reflection-type optoelectronic semiconductor device, an LED chip is disposed on a chip carrier. A primary light is emitted from a light emission face. The chip carrier is a first conducting wire portion. A second conducting wire portion is connected to the LED chip via a connection wire. A packaging body is used to seal the LED chip, the first conducting wire portion, and part of the second conducting wire portion. A reflecting face is further disposed in an opposite direction of the light emission face of the LED chip and surrounds a first surface of the packaging body. An optical spectrum conversion layer is coated onto a second surface of the packaging body. The optical spectrum conversion layer can effectively harmonize the uniformity of light, and can be modulated to the desired light emission spectrum.

The primary light emitted by the LED chip will be reflected to the optical spectrum conversion layer by the reflecting face to undergo light excitation in the optical spectrum conversion layer for producing a secondary light. The primary light and the secondary light will be combined to accomplish complete matching of light vector so as to generate a mixed light. A lens can be placed in the travel direction of the mixed light to change the distribution of the mixed light.

According to another embodiment of the present invention, in a reflection-type optoelectronic semiconductor device, at least an LED chip is disposed on a chip carrier. The chip carrier is a first conducting wire portion. A second conducting wire portion is connected to each of these LED chips. A packaging body is used to seal these LED chips and part of these first and second conducting wire portions. A reflecting face is further disposed in an opposite direction of the light emission face of these LED chips and surrounds the packaging body. An optical spectrum conversion layer is coated onto a second surface of the packaging body. The optical spectrum conversion layer can effectively harmonize the uniformity of light, and can be modulated to the desired light emission spectrum.

The light emitted by these LED chips will be reflected to the optical spectrum conversion layer by the reflecting face to undergo light excitation in the optical spectrum conversion layer for producing a fluorescent light more efficiently. Color mixing can be accomplished through different color lights emitted by these LED chips to achieve a full-color light emission. A lens can be placed in the travel direction of light to change the distribution of light.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawing, which are given by way of illustration only, and thus are not limitative of the present invention, and in which.

DETAILED DESCRIPTION OF THE PREFERRED EMBODIMENTS

Figure 1:
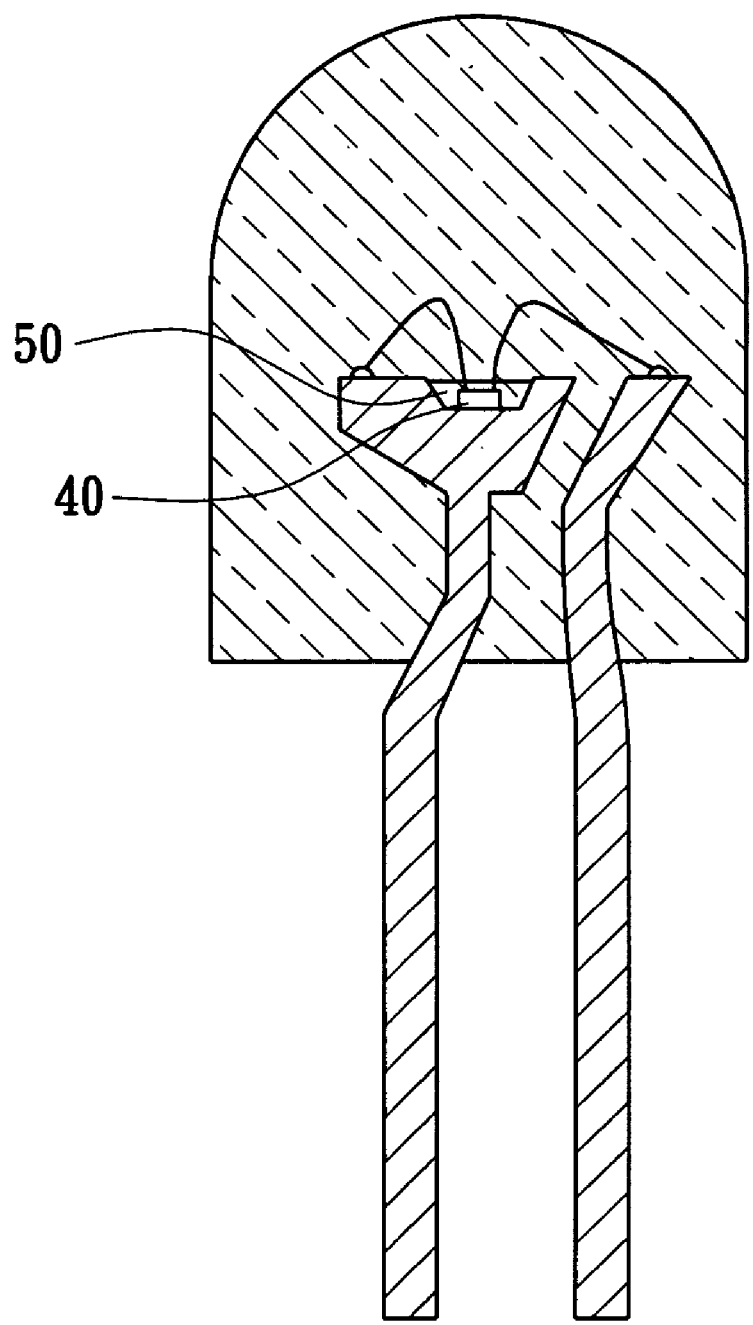
FIG. 1 is a structure diagram of a lens-type inorganic white LED in the prior art.
Figure 2A:
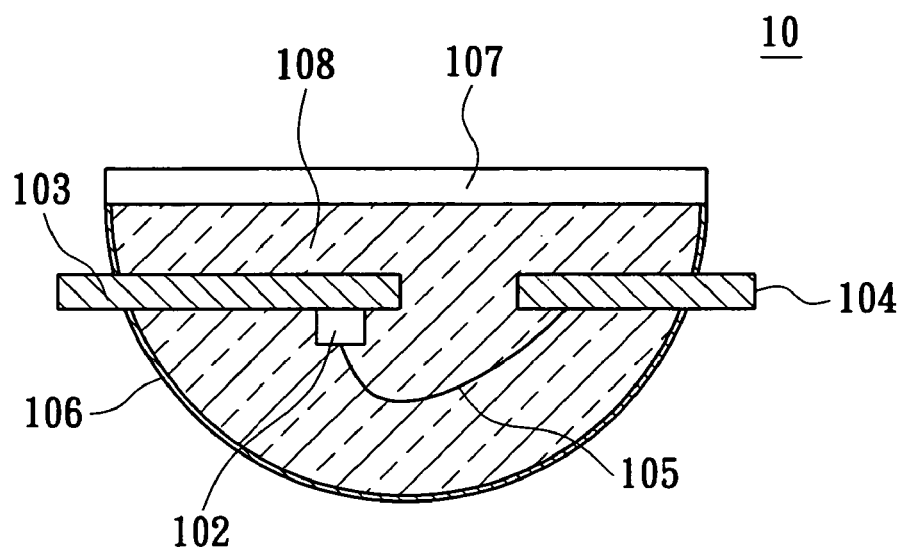
FIG. 2A is a perspective cross-sectional view of a reflection-type optoelectronic semiconductor device according to a first embodiment of the present invention.
Figure 2B:
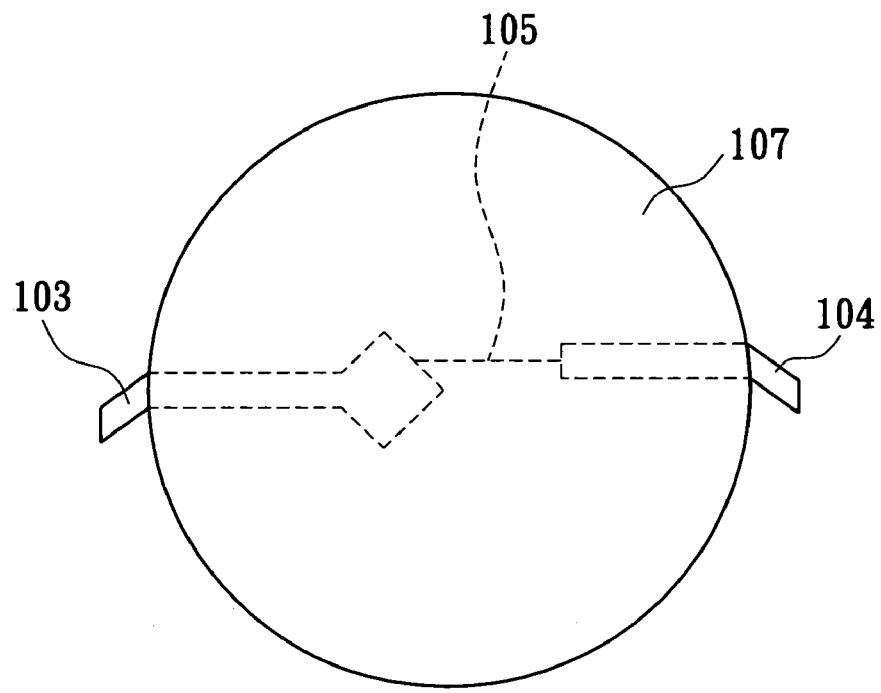
FIG. 2B is a perspective front view of the first embodiment of the present invention.

As shown in FIGS. 2A and 2B, a reflection-type optoelectronic semiconductor device 10 comprises an LED chip 102, a first conducting wire portion 103, a second conducting wire portion 104, a connection wire 105, a reflecting face 106, an optical spectrum conversion layer 107, and a packaging body 108.

The LED chip 102 is mounted on a chip carrier. The chip carrier is the first conducting wire portion 103. The LED chip 102 is connected to the second conducting wire portion 104 via the connection wire 105. The LED chip 102, part of the first conducting wire portion 103 and the second conducting wire portion 104, and the connection wire 105 are sealed by the packaging body 108 into a single unit. The reflecting face 106 is disposed in an opposite direction of a light emission face of the LED chip 102 and surrounds the packaging body 108. The reflecting face 106 is formed by mirror processing like electroplating or metal evaporation. The optical spectrum conversion layer 107 is coated onto a second surface of the packaging body 108 to form a light emission face above the packaging body 108.

The above chip carrier 103 is an opaque conductor or a transparent conductor. The reflecting face 106 is a parabolic surface or an elliptic surface with the LED chip 102 as the focus. Other parts of the first and second conducting wire portions 103 and 104 are exposed by the packaging body 108 for connection with an external circuit (not shown). Moreover, the packaging body 108 is a transparent packaging body pervious to light. The optical spectrum conversion layer 107 includes a fluorescent body, a disposing agent, or both.

The LED chip 102 is connected to an external circuit (not shown) through other part of the first and second conducting wire portions 103 and 104 exposed by the packaging body 108 to get the power required for light emission. Light from the LED chip 102 is reflected by the reflecting face 106 of a parabolic surface shape or an elliptic surface shape. The reflected light is effectively projected forwards to the optical spectrum conversion layer 107 to undergo light excitation for emitting a fluorescent light more efficiently.

As shown in FIG. 2B, the first conducting wire portion 103 is inserted into the packaging body 108. The LED chip 102 is placed at the tail end of the first conducting wire portion 103. The second conducting wire portion 104 is also inserted into the packaging body 108, and is connected to the LED chip 102 via the connection wire 105. According to a preferred embodiment of the present invention, the LED chip 102 is located at the focus of the reflecting face 106 of FIG. 2A so that light from the LED chip 102 can be effectively reflected by the reflecting face 106 and then parallel-projected out from the optical spectrum conversion layer 107.

A primary light from the LED chip 102 will be reflected to the optical spectrum conversion layer 107 by the reflecting face 106 to undergo light excitation in the optical spectrum conversion layer 107 for producing a secondary light. The primary light and the secondary light are then combined to accomplish complete matching of light vector for producing a mixed light.

When a blue LED chip is used as the LED chip 102 and the optical spectrum conversion layer 107 having a yellow light fluorescent body is matched, a white light can be formed from the light emission face by mixing a blue light and a yellow light and then parallel-projected out.

Figure 3A:
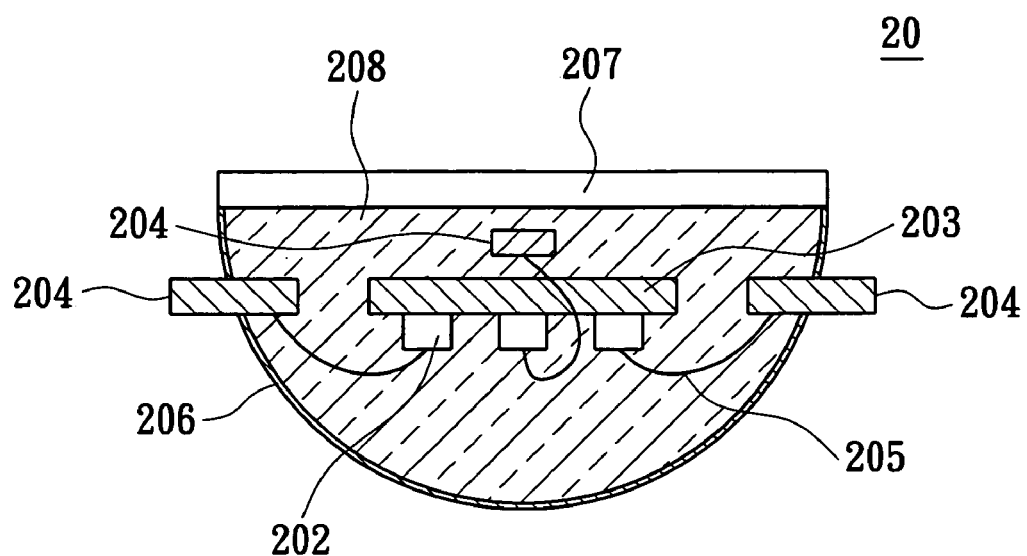
FIG. 3A is a perspective cross-sectional view of a reflection-type optoelectronic semiconductor device according to a second embodiment of the present invention.
Figure 3B:
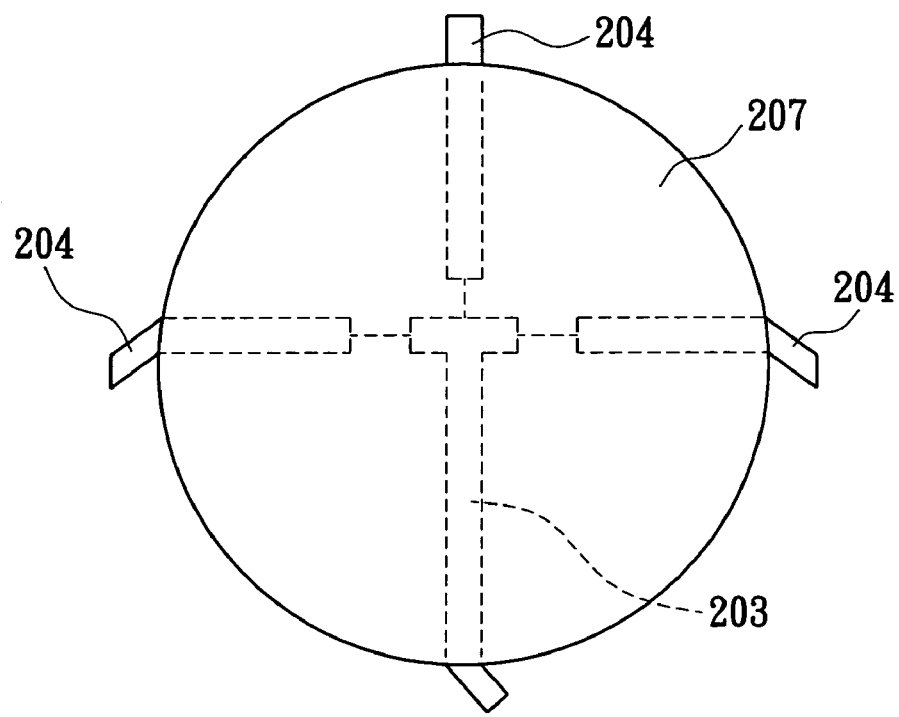
FIG. 3B is a perspective front view of the second embodiment of the present invention.

As shown in FIGS. 3A and 3B, in a reflection-type optoelectronic semiconductor device 20, three LED chips 202 are disposed on a chip carrier 203. The chip carrier is a first conducting wire portion 203. Each of the LED chips 202 is connected to a second conducting wire portion 204 via a connection wire 205. The LED chips 202, the first conducting wire portion 203, part of the second conducting wire portions 204, and the connection wires 205 are sealed by a packaging body 208 into a single unit. A reflecting face 206 is disposed in an opposite direction of a light emission face of the LED chips 202 and surrounds a first surface of the packaging body 208. The reflecting face 206 is formed by mirror processing like electroplating or metal evaporation. An optical spectrum conversion layer 207 is coated onto a second surface of the packaging body 208 to form a light emission face above the packaging body 208.

As shown in FIG. 3B, the first conducting wire portion 203 is inserted into the packaging body 208. The three LED chips 202 are placed at the tail end of the first conducting wire portion 203. The three second conducting wire portions 204 are also inserted into the packaging body 208 in different directions, and are connected to the three LED chips 202 via the three connection wires 205. The first conducting wire portion 203 and the second conducting wire portions 204 protrude out of the packaging body 208 to form external electrodes of the reflection-type optoelectronic semiconductor device.

The above chip carrier 203 is an opaque conductor or a transparent conductor. The reflecting face 206 is a parabolic surface or an elliptic surface with the LED chips 202 as the focus/foci. Other parts of the first conducting wire portion 203 and the second conducting wire portions 204 are exposed by the packaging body 208 for connection with an external circuit (not shown). Moreover, the packaging body 208 is a transparent packaging body pervious to light. The optical spectrum conversion layer 207 contains a fluorescent body and a disposing agent or one of them.

Light from the LED chips 202 will be reflected by the reflecting face 206 of a parabolic surface shape or an elliptic surface shape and undergoes light harmonization in the packaging body 208. The reflected light is effectively projected forwards to the optical spectrum conversion layer 207 to undergo light excitation for producing a fluorescent light more efficiently. Moreover, color mixing can be accomplished through different color lights emitted by these LED chips 202 and light excitation in the optical spectrum conversion layer 207 to achieve full-color light emission.

Figure 4A:
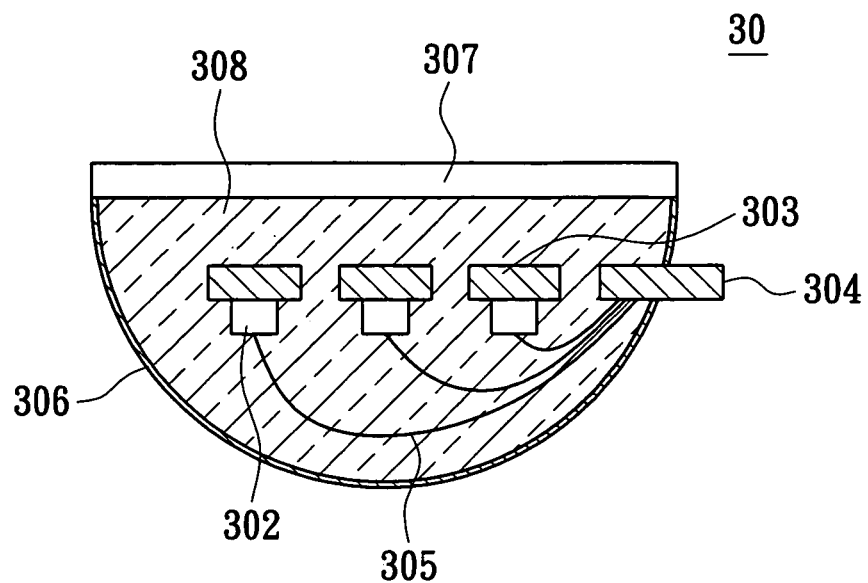
FIG. 4A is a perspective cross-sectional view of a reflection-type optoelectronic semiconductor device according to a third embodiment of the present invention.
Figure 4B:
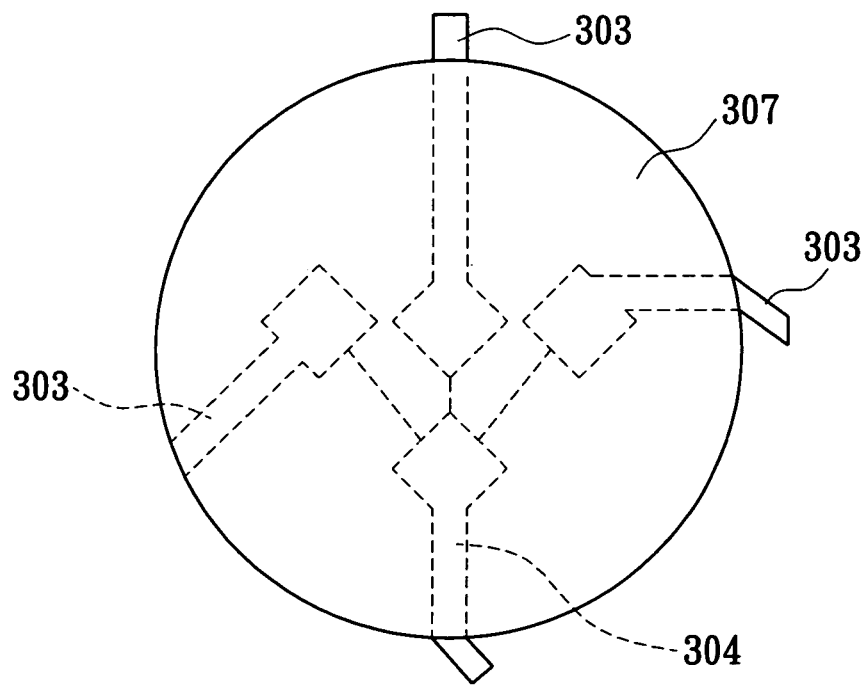
FIG. 4B is a perspective front view of the third embodiment of the present invention.

Reference is made to FIGS. 4A and 4B as well as FIGS. 3A and 3B. In a reflection-type optoelectronic semiconductor device 30, three LED chips 302 are used for emission of different color lights. Similarly, a reflecting face 306 of a parabolic surface shape or an elliptic surface shape is used for light reflection. Light harmonization is accomplished in a packaging body 308. The reflected light is similarly projected forwards to an optical spectrum conversion layer 307 to undergo light excitation for producing a fluorescent light more efficiently.

Reference is made to FIGS. 4A and 4B as well as FIGS. 3A and 3B. The reflection-type optoelectronic semiconductor device 30 differs from the reflection-type optoelectronic semiconductor device 20 only in the positions and the connection way of these LED chips 302. Each of these LED chips 302 is disposed on a chip carrier. The chip carrier is a first conducting wire portion 303. Each of these LED chips 302 is connected to a second conducting wire portion 304 via a connection wire 305. The LED chips 302, the first conducting wire portions 303, part of the second conducting wire portion 204, and the connection wires 205 are sealed by a packaging body 308 into a single unit.

Reference is made to FIGS. 4A and 4B as well as FIGS. 3A and 3B. The light emission principle of the reflection-type optoelectronic semiconductor device 30 in FIG. 4 is the same as that of the reflection-type optoelectronic semiconductor device 20 in FIG. 3 and thus is not further illustrated.

Figure 5A:
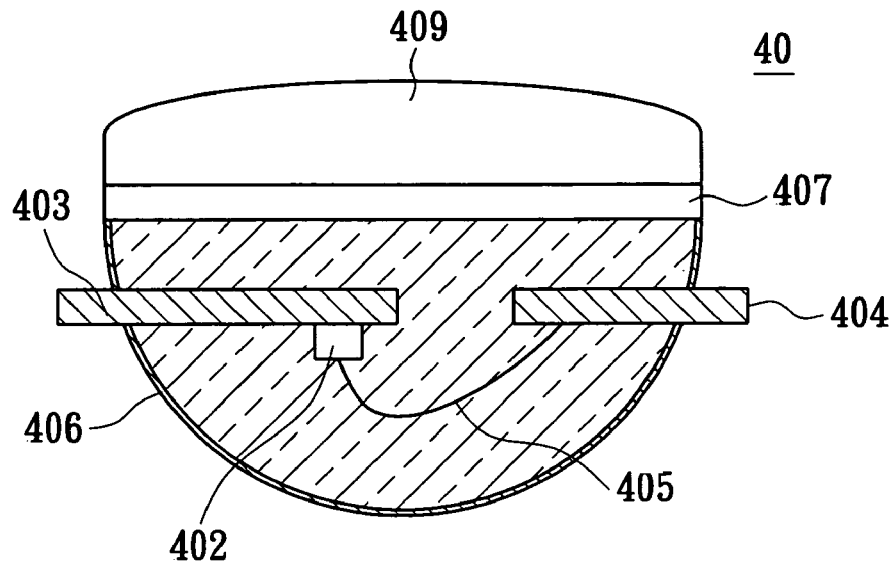
FIG. 5A is a perspective cross-sectional view of a reflection-type optoelectronic semiconductor device according to a fourth embodiment of the present invention.
Figure 5B:
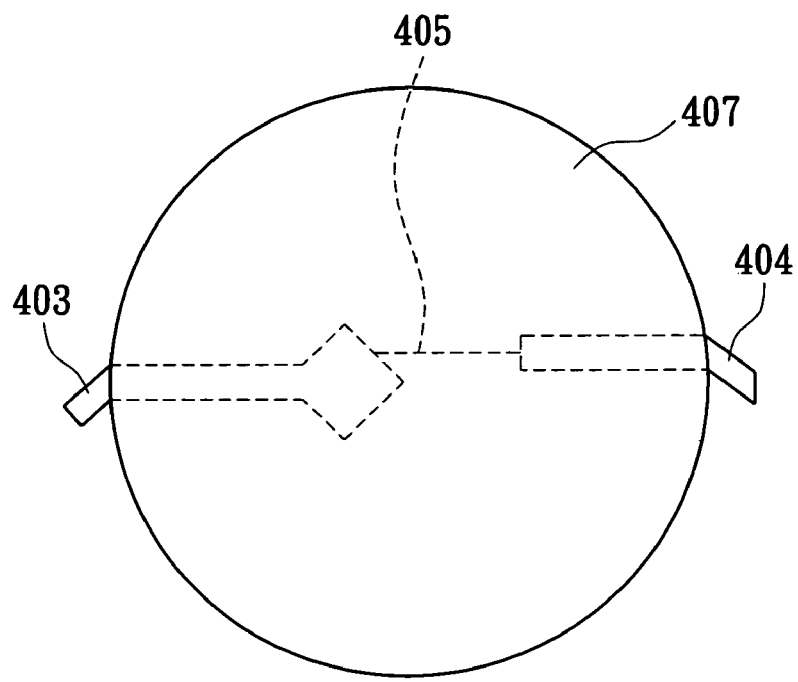
FIG. 5B is a perspective front view of the fourth embodiment of the present invention.

Reference is made to FIGS. 5A and 5B as well as FIGS. 2A and 2B. A reflection-type optoelectronic semiconductor device 40 in FIG. 5 differs from the reflection-type optoelectronic semiconductor device 10 in FIG. 2 only in that a lens 409 is added onto an optical spectrum conversion layer 407.

To sum up, the present invention makes use of a reflecting face of a parabolic surface shape or an elliptic surface shape to reflect light from an LED chip. The reflected light can be effectively projected forwards to an optical spectrum conversion layer to undergo light excitation for producing a fluorescent light more efficiently. Moreover, through different disposition ways of the first and second conducting wire portions disclosed in the first to fourth preferred embodiments of the present invention, several LED chips can be placed on one or several first conducting wire portions. Moreover, one or several second conducting wire portions can be used to connect several LED chips.

Furthermore, color mixing can be accomplished through different colors of light emitted by these LED chips to achieve full-color light emission and light excitation in the optical spectrum conversion layer. A lens can also be placed in the travel direction of light to change the distribution of light.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A reflection-type optoelectronic semiconductor device, comprising:
    at least an LED chip disposed on at least a chip carrier for generating a primary light, said chip carrier being a first conducting wire portion;
    at least a second conducting wire portion connected to said LED chip via connection wires;
    a packaging body for sealing said LED chip and part of said first and second conducting wire portions;
    a reflecting face disposed in an opposite direction of a light emission face of said LED chip for reflecting the primary light and surrounding a first surface of said packaging body; and
    an optical spectrum conversion layer coated onto a second surface of said packaging body and used to receive light reflected by said reflecting face and produce a secondary light;
    wherein the primary light and the secondary light combine to accomplish matching of a light vector for producing a mixed light.

2. The reflection-type optoelectronic semiconductor device as claimed in claim 1, wherein said chip carrier is an opaque conductor or a transparent conductor.

3. The reflection-type optoelectronic semiconductor device as claimed in claim 1, wherein said reflecting face is a parabolic surface or an elliptic surface with said LED chip as its focus.

4. The reflection-type optoelectronic semiconductor device as claimed in claim 1, wherein another part of said first and second conducting wire portion is exposed by said packaging body for connection with an external circuit.

5. The reflection-type optoelectronic semiconductor device as claimed in claim 1, wherein said packaging body is a transparent packaging body penetrable by light.

6. The reflection-type optoelectronic semiconductor device as claimed in claim 1, wherein said optical spectrum conversion layer contains a fluorescent body and a dispersing agent.

7. The reflection-type optoelectronic semiconductor device as claimed in claim 1, wherein said optical spectrum conversion layer contains a fluorescent body or a dispersing agent.

8. The reflection-type optoelectronic semiconductor device as claimed in claim 1, wherein the primary light emitted by said LED chip is reflected to said optical spectrum conversion layer by said reflecting face to undergo light excitation in said optical spectrum conversion layer for producing the secondary light.

9. The reflection-type optoelectronic semiconductor device as claimed in claim 1, further comprising:
    a lens placed on said optical spectrum conversion layer to change the direction of light.

10. The reflection-type optoelectronic semiconductor device as claimed in claim 9, wherein said chip carrier is an opaque conductor or a transparent conductor.

11. The reflection-type optoelectronic semiconductor device as claimed in claim 9, wherein said reflecting face is a parabolic surface or an elliptic surface with said LED chip as its focus.

12. The reflection-type optoelectronic semiconductor device as claimed in claim 9, wherein another part of said first and second conducting wire portion is exposed by said packaging body for connection with an external circuit.

13. The reflection-type optoelectronic semiconductor device as claimed in claim 9, wherein said packaging body is a transparent packaging body penetrable by light.

14. The reflection-type optoelectronic semiconductor device as claimed in claim 9, wherein said optical spectrum conversion layer contains a fluorescent body and a dispersing agent.

15. The reflection-type optoelectronic semiconductor device as claimed in claim 9, wherein said optical spectrum conversion layer contains a fluorescent body or a dispersing agent.

16. The reflection-type optoelectronic semiconductor device as claimed in claim 9, wherein light emitted by said LED chip is reflected to said optical spectrum conversion layer by said reflecting face to undergo a light excitation function in said optical spectrum conversion layer to produce a mixed light.

* * * * *